(12) United States Patent
Kelly et al.

(10) Patent No.: US 7,928,381 B1
(45) Date of Patent: Apr. 19, 2011

(54) COAXIAL CHARGED PARTICLE ENERGY ANALYZER

(75) Inventors: Michael A. Kelly, Portola Valley, CA (US); Charles E. Bryson, III, Hollister, CA (US); Warren Wu, Mountain View, CA (US)

(73) Assignee: Apparati, Inc., Hollister, CA (US)

( * ) Notice: Subject to any disclaimer, the term of this patent is extended or adjusted under 35 U.S.C. 154(b) by 630 days.

(21) Appl. No.: 11/437,986

(22) Filed: May 19, 2006

(51) Int. Cl.
 *H01J 37/28* (2006.01)
(52) U.S. Cl. .......... 250/310; 250/305; 250/397
(58) Field of Classification Search .......... 250/310
 See application file for complete search history.

(56) References Cited

U.S. PATENT DOCUMENTS

| | | | | |
|---|---|---|---|---|
| 3,681,600 A * | 8/1972 | Rigden et al. | | 250/305 |
| 3,805,068 A * | 4/1974 | Lee | | 250/305 |
| 5,299,138 A * | 3/1994 | Fiori et al. | | 702/22 |
| 5,444,242 A * | 8/1995 | Larson et al. | | 250/305 |
| 5,578,821 A * | 11/1996 | Meisberger et al. | | 250/310 |
| 6,333,508 B1 * | 12/2001 | Katsap et al. | | 250/492.2 |
| 6,803,570 B1 | 10/2004 | Bryson, III et al. | | 250/305 |
| 6,979,824 B1 * | 12/2005 | Adler et al. | | 850/9 |
| 2004/0227077 A1 * | 11/2004 | Takagi et al. | | 250/310 |
| 2005/0045832 A1 | 3/2005 | Kelly et al. | | 250/397 |
| 2006/0226360 A1 * | 10/2006 | Frosien | | 250/310 |
| 2007/0200069 A1 * | 8/2007 | Frosien et al. | | 250/396 R |

OTHER PUBLICATIONS

Tepermeister et al., "Modeling and construction of a novel electron energy analyzer for rapid x-ray photoelectron spectroscopy spectra acquisition", *Rev. Sci. Instrum.*, vol. 63, No. 8, Aug. 1992, 3828-3834 pp.

* cited by examiner

*Primary Examiner* — Phillip A Johnston
(74) *Attorney, Agent, or Firm* — Charles S. Guenzer

(57) ABSTRACT

A non-dispersive electrostatic energy analyzer for electrons and other charged particles having a generally coaxial structure of a sequentially arranged sections of an electrostatic lens to focus the beam through an iris and preferably including an ellipsoidally shaped input grid for collimating a wide acceptance beam from a charged-particle source, an electrostatic high-pass filter including a planar exit grid, and an electrostatic low-pass filter. The low-pass filter is configured to reflect low-energy particles back towards a charged particle detector located within the low-pass filter. Each section comprises multiple tubular or conical electrodes arranged about the central axis. The voltages on the lens are scanned to place a selected energy band of the accepted beam at a selected energy at the iris. Voltages on the high-pass and low-pass filters remain substantially fixed during the scan.

34 Claims, 5 Drawing Sheets

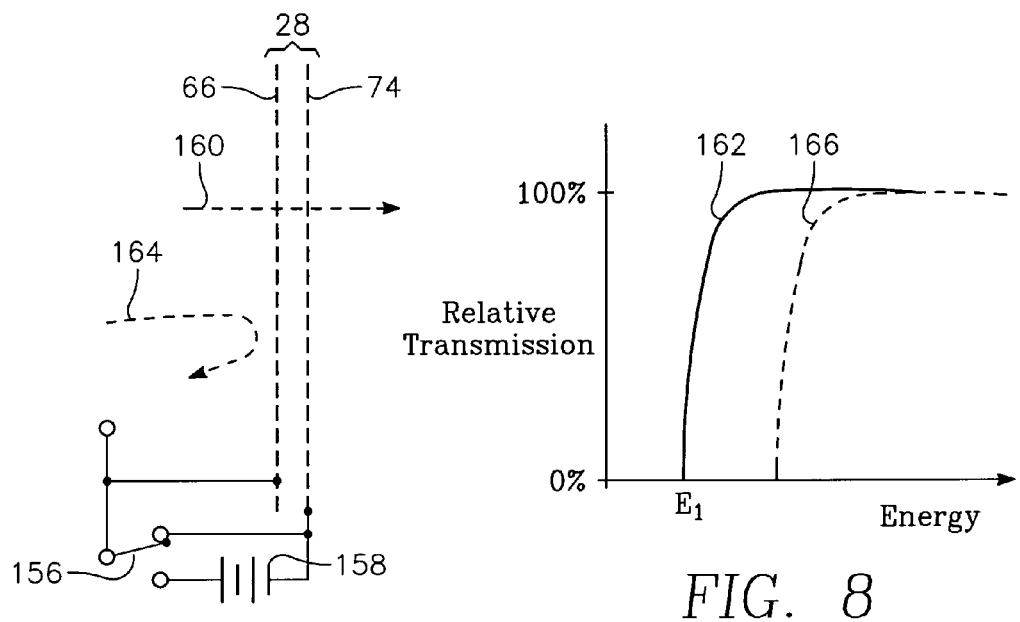
FIG. 7
FIG. 8
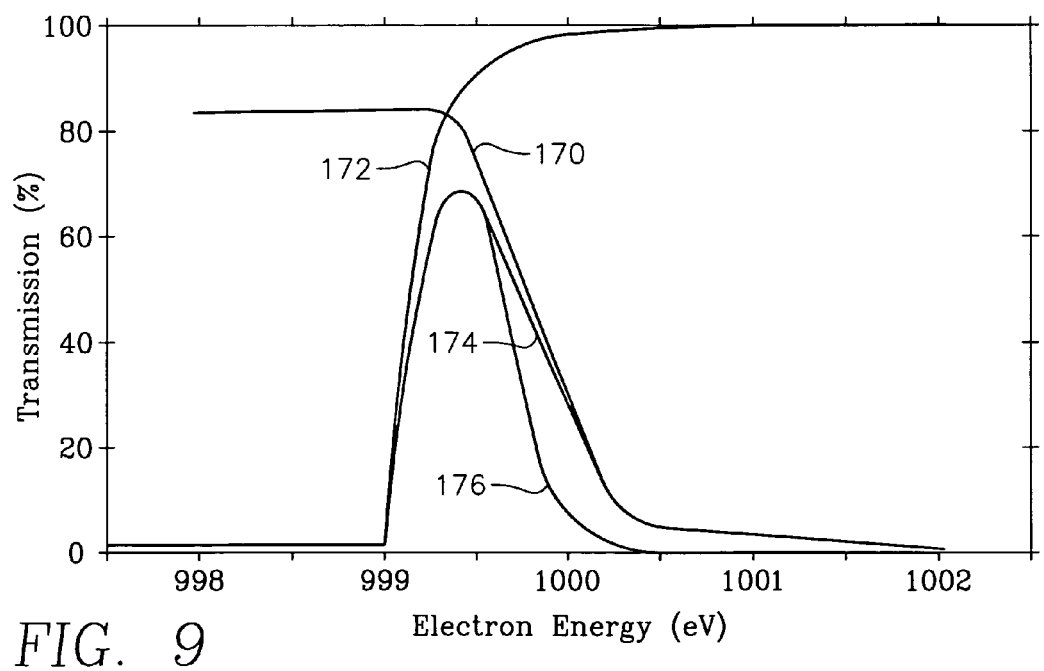
FIG. 9

COAXIAL CHARGED PARTICLE ENERGY ANALYZER

GOVERNMENT INTEREST

This invention was partially developed under NASA Contract No. SBIR NNC04CA20C. The government may have certain rights in the invention.

FIELD OF THE INVENTION

The invention relates generally to analyzers for charged particle beams. In particular, the invention relates to electrostatic energy analyzers of electrons or other charged particles.

BACKGROUND ART

Charged particle energy analyzers, also called spectrometers, are used in many scientific and technical applications in which the energy distribution of charged particles such as electrons are measured. Such uses include characterizing the composition and other properties of materials in which the electron energy needs to be measured, for example, X-ray photoelectron spectrometers and electron spectrometers, and secondary ion spectrometers. Similar spectroscopes, such as secondary ion spectrometers, have been applied to other charged particles, such as energetic ions. Many scientific experiments require accurate measurement of the energy distribution of charged particles.

The performance of a charged particle energy analyzer, of which an electron energy analyzer is but one example but the most prevalent one, is gauged by several conflicting characteristics. It needs to have a narrow resolution over a reasonably large energy band and the selected energy should be easily tuned. Its resolution needs to be stable and not require repeated calibration. The energy analyzer needs to have a high detection efficiency, which results in a high throughput of analyzed samples. Of especial importance in material characterization in which secondary electrons or ions are emitted over a wide angle from the material being probed, the energy analyzer should have a wide aperture and a wide acceptance angle to thereby increase the collection efficiency. A typical requirement of a commercial electron energy analyzer is that it be able to analyze 10 to 20% of the electrons emitted from the material and to distinguish electrons whose energies differ by as little as 0.1%.

Commercial energy analyzers should be rugged, small, easy to operate, and relatively inexpensive. If these commercial characteristics can be improved, materials analysis equipment can more readily find acceptance in production environments, such as in-line processing monitors in the semiconductor industry. Such characteristics are also important for remote operation, such as the search for life on Mars. For space applications, an energy analyzer needs to be lightweight, a characteristic also desired for other applications.

Dispersive energy analyzers rely upon electrostatic or magnetic deflection of the charged particles to select the energy of the particle to be detected. Although effective at very high resolution, dispersive energy analyzers tend to be large and have relatively small acceptance apertures, which result in a low measurement throughput. On the other hand, non-dispersive energy analyzers typically rely upon serially arranged low-pass and high-pass energy filters to allow only the particles within a selected energy band to reach the detector. A low-pass filter passes particles having energies below a cutoff energy and blocks those above. A high-pass filter passes particles having energies above another cutoff energy and blocks those below. It is understood that the cutoff energy need not represent a sharp discontinuity in the transmission factor, which may vary somewhat gradually across the cutoff energy.

Two of the present inventors disclose a compact non-dispersive energy analyzer for analyzing the energy of electrons in the range of a few electron volts (eV) to a few keV in U.S. patent application Ser. No. 10/961,631, filed Oct. 8, 2004 and published as U.S. Patent Application Publication 2005/0045832 A1, incorporated herein by reference. This energy analyzer includes an initial low-pass filter followed by a high-pass filter, both of which incorporate biased electrical grids through which the charged particles of the proper energy may pass. In particular, the low-pass filter includes a curved grid which together with a similarly curved electrode in back of it reflects the low-energy electrons into a collimated beam, which then passes through a planar high-pass grid filter. The energy overlap of the low-pass and high-pass filters determines the overall pass band of the energy analyzer, which is tuned to provide an energy spectrum.

The described energy analyzer provides superior performance. However, we now believe that its fabrication is overly complex particularly because of the curved grid, which should be large and ellipsoidally shaped. Further, the preferred embodiments include an entrance section arranged along an axis generally perpendicularly to the axis of the rest of the cylindrically shaped chamber so that the overall size and weight of the analyzer are increased, thereby decreasing the usefulness of the design for space applications. The reference also describes a coaxial design, but this design requires the electron source, typically a sample being irradiated by probe particles or radiation, to be inserted into the middle of the high-vacuum coaxial analyzer. Such a sample insertion is disadvantageous for remote high-throughput operation as required for a space application or even for an industrial application. In any case, a sample apparatus located in the beam path between the low-pass and high-pass filters is bound to absorb some of the desired back-reflected electrons and reduce the throughput of the analyzer.

Tepermeister et al. disclose a coaxial two-section analyzer in "Modeling and construction of a novel electron energy analyzer for rapid x-ray photoelectron spectroscopy spectra acquisition," *Review of Scientific Instrumentation*, vol. 62, no. 8, August 1992, pp. 3828-3834. However, the Tepermeister design includes two large curved grids between its two sections and does not control the energy of the particles incident on the first section and does not focus them before entering the first section. Thus, the Tepermeister analyzer is considered to be large, difficult to build, and provide low throughput.

A compact, economical, and efficient charged particle analyzer is thus still needed for many applications both in the laboratory and commercial production line and in demanding space applications.

SUMMARY OF THE INVENTION

In one aspect of the invention, a charged particle energy analyzer, for example, an electron energy analyzer, includes a coaxial set of electrostatic optics including a series of coaxial electrodes forming walls of the analyzer. The electrodes may have tubular or conical shapes. A charged particle detector detects the intensity of charged particles passed by the low-pass filter.

In one aspect of the invention, the charged particle analyzer includes a high-pass electrostatic filter followed by a low-pass electrostatic filter. The high-pass filter may include a plurality of differentially biased wall electrodes. Preferably, one or more biased planar grids separate the two filters.

An electrostatic lens may be placed between the source of the charged particles, such as electrons. The lens, which may include a plurality of differentially biased wall electrodes, advantageously includes elements including a biased iris which controls the energy of the charged particle entering the high-pass filter. Preferably, the lens selectively controls, e.g. reduces, the energy of the charge particle entering the high-pass filter to a substantially constant input energy such that the energy spectrum may be scanned substantially within the lens while the downstream elements process charged particles of substantially the same energy and the voltages of their electrostatic elements are not substantially changed during the scan. That is, the energy scanning is preferably performed in the lens with a selected amount of acceleration or retardation so that the selected energy band enters the filters at a substantially fixed energy.

In one design based on coaxial electrodes, the particle detector is placed within the low-pass filter and accepts only charged particles entering it from the downstream side.

The lens, which may be composed of coaxial electrodes similar to those of the filters, may focus the charged particles through an iris at the input to the filters. The lens may include at its input a curved mesh having a concave side facing the source of charged particles. The mesh shape is preferably aspheric and more preferably ellipsoidal.

A dual screen comprising two grids may separate the high-pass and low-pass filters. In normal operation, both grids are biased to substantially the same voltage, which may be that of the adjacent coaxial electrodes. However, in a calibration mode, the first grid is biased more negative (for electrons) than the second grid so that no charged particles within the passband pass the screen according to the design. Nonetheless, those charged particles are detected at the output of the low-pass filter, which detected particles represent spurious signals or noise. The spurious spectrum is subtracted from the spectrum detected in normal mode to optimize the resolution of the analyzer.

BRIEF DESCRIPTION OF THE DRAWINGS

FIG. 7 is a schematic illustration of the effect of differential biasing of the two grids between the high-pass and low-pass filters.

FIG. 8 is a graph showing the resultant spectra in the biasing of the two grids.

FIG. 9 is a graph of the transmission coefficients associated with different aspects of the invention.

DETAILED DESCRIPTION OF THE PREFERRED EMBODIMENTS

Figure 1:
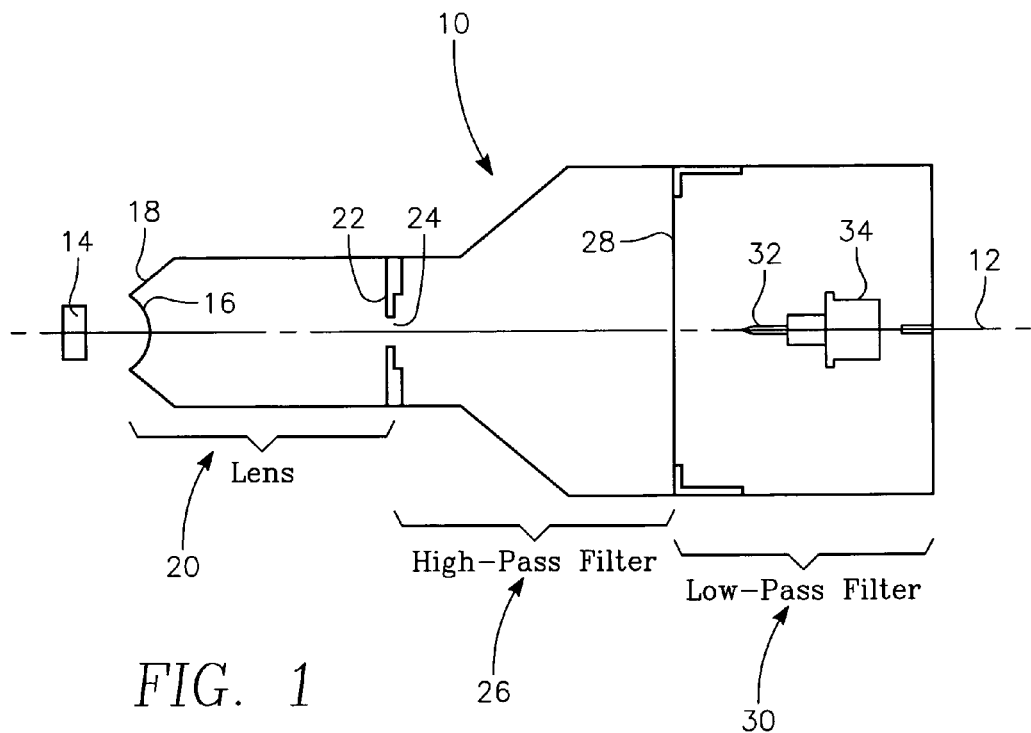
FIG. 1 is a cross-sectional view of an electron energy analyzer, which is an embodiment if the invention.

A first embodiment of a coaxial electron energy analyzer 10 of the invention is schematically illustrated in the cross-sectional view of FIG. 1. The analyzer 10 is generally circularly symmetrical shaped about a central axis 12. The entrance end of the analyzer 10 is positioned next to a sample 14 which emits electrons in the eV to low-keV energy range. The sample 14 is preferably also located on the central axis 12 but it may be inclined to accommodate the probe beam which excites the electrons from the sample 14. The entrance end includes a curved input grid 16, preferably aspherically shaped and more preferably ellipsoidally shaped, which accepts electrons from the sample 14 within an acceptance half angle α and, in cooperation with potentials on other lens electrodes of an electrostatic input lens 20, focus them on the plane of an iris 22. The aspheric grid 16 may be ellipsoidally shaped by hydraulically compressing an 80-mesh stainless steel screen mesh sandwiched between aluminum foil and copper disks against a concave ellipsoidal mold while holding the outer periphery of the screen sandwich above the lip of the mold. Although it is not required, the aspheric grid 16 is held at the same potential as the sample 14 so that the electrons leaving the sample 14 are in a field-free region.

The aspheric grid 14 is mounted on and electrically connected to a conically shaped end electrode 18 of the electrostatic lens 20, which is coaxial about the central axis 12. Several differentially biased coaxial electrodes of either tubular or conical shape, to be illustrated in detail later, form the side walls of the lens 20. The biased iris 22 has a central aperture 24 on which the lens 20 including the curved input grid 16 focuses the electron trajectories. In one implementation, the iris 22 is biased such that an electron leaving the sample 14 at any energy selected for analysis between 50 and 1500 eV exits the aperture 24 at a fixed energy for the selected analysis energy of 1000 eV in the standard mode and between 200 and 500 eV, for example, 333 eV, in the high-resolution mode. That is, the lens 20 may act as either a retarding or an accelerating lens depending upon the biasing of the different electrodes in the lens 20 so that the electrons enter the following sections within standard bandpass energies of those filters.

The electrons passing through the aperture 24 enter an electrostatic high-pass filter 26, which is coaxial about the central axis 12 and has a narrow entrance end having a diameter of that of the exit end of the lens 20 but then flaring to a wider exit end. Differentially biased conical or tubular (round) electrodes, to be illustrated in more detail later, form the side walls of the high-pass filter 26. A biased dual screen 28 is placed at the wider exit end of the high-pass filter 28 perpendicular to the central axis 12. Advantageously, the large dual screen 28 may be planar, greatly simplifying the design and fabrication of the analyzer. The first grid in the dual screen 28 in typical operation is biased at nearly the same voltage as the last electrode in the high-pass filter 26.

The electrodes in the high-pass filter 26 are biased to retard the energy of the electrons so that all those below the cutoff energy of the high-pass filter 24 (approximately 1000 eV at its input in the low-resolution mode and about 1 or 2 eV or even less at its output) have insufficient energy to reach the dual screen 28 and are reflected from it. Those electrons having energy greater than the cutoff energy pass through the dual screen 28. Those having only slightly more energy approach the dual screen 28 at nearly normal angles at pass through it perpendicularly.

The second grid 74 is not required for normal operation in which the two grids are held at the same potential. However, the two grids 66, 72 allow spurious electrons to be canceled by reference to a calibration run. Specifically, if in a calibration mode the first grid is set to a voltage above the selected bandpass while the second grid is set to the normal voltage at the bottom of bandpass, no electrons passing the first grid should be within the selected bandpass. Any electrons which are nonetheless detected in the calibrating mode are spurious. The detected intensity in the calibration mode represents background signal, which can be subtracted from the detected intensity in the normal mode when the two grids are held at the same potential, thereby sharpening the bandpass.

Those electrons above the cutoff energy enter an electrostatic low-pass filter 30 which has a diameter equal to that of the exit end of the high-pass filter 26. The low-pass filter 30 includes a series of coaxial electrodes along its sidewalls and back wall. These electrodes deflect low-energy electrons toward the electron detector 34 while allowing higher-energy electrons to strike either the electrodes or the front housing of the detector 34. Also, a central nose electrode 32 in front of an electron detector 34 deflects low-energy electrons away from the central axis 12. The detector 34 is located so that only low-energy electron that are deflected from the electrodes of the low-pass filter 30 enter it. The low-energy electrons for the most part need to reverse directions to reach the sensitive part of the detector 34 located at the downstream side of the detector 34. As a result, the low-pass filter 30 also acts as an electrostatic reflecting lens.

In one implementation, the sample 14 is separated from the annular rim of the grid 16 by 0.85" (22 mm) and $\alpha=25°$ for an analysis area on the sample having a 3.5 mm diameter. The tubular diameter of the lens 20 is about 2.5" (64 mm), the diameter of the low-pass filter 30 is about 5.9" (150 mm), and the total length is about 15.4" (390 mm).

Figure 2:
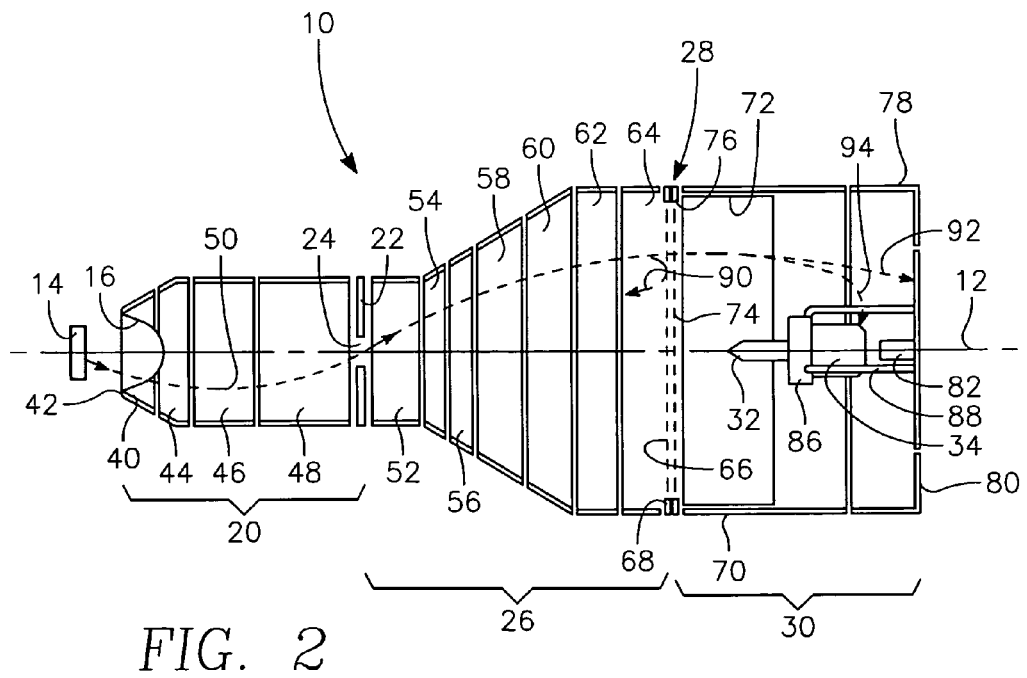
FIG. 2 is a cross-sectional view of an electron analyzer similar to that of FIG. 1 but more clearly illustrating the electrode and other structure.

A more detailed structural view of one design of the analyzer 10 is shown in cross section in FIG. 2. The lens 20 includes a conically shaped electrode 40 on which a flange 42 of the aspheric mesh 16 is mounted and is electrically connected. The lens 20 further includes a combined conical and tubular electrode 44, tubular electrodes 46, 48 and the independently biased iris 22. All the electrodes are coaxial about the central axis 12. The lens 20 tends to focus every electron trajectory 50 having the desired bandpass energy through the aperture 24 of the iris 22.

The high-pass filter 26 includes a tubular entry electrode 52, conical electrodes 54, 56, 58, 60 of increasing diameters, and a tubular exit electrode 64, all coaxial about the central axis 12. A first grid 66 of the dual screen 28 is mounted on a flange 68 on the back of the exit electrode 64 and electrically connected to it.

The low-pass filter 30 includes a tubular entry electrode 70 partially inside of which is disposed a separately biasable band-shaped grid electrode 72. A second grid 74 of the dual screen 28 is mounted on a flange 76 on the front of the entry electrode 70 and is electrically connected to it. The low-pass filter 30 further includes a can-shaped electrode 78 forming the part of the sidewall and part of the back wall of the low-pass filter 30. A circular back electrode 80 fits within an aperture in the can-shaped electrode 78 and includes a projection 82 towards the detector 34. The back electrode 80, the projection 82 in back of the detector 34, and the nose electrode 32 in front of the detector 34 may be commonly biased. All the electrodes in the low-pass filter 30 are coaxial about the central axis 12 and are biased to optimize the reflected electrons within the passband and also to absorb those of higher energy.

The detector 34, which may be in the form of two microchannel plates (MCPs), is covered by a wire mesh on the back of a detector housing 86, which is supported by multiple legs 88 on the back electrode 80. Electrical lines for the detector 34, the detector housing, and the nose electrode 32 are led through the interior of the legs 88. The detector mesh may be held at about 5V to attract low-energy electrons while the detector housing is held at the potential of the second flat grid 74. Only the electrons having energies less than about 1 eV when they pass through the flat grids 66, 74 pass through the wire mesh covering the detector 34. Other electrons within the low-pass filter 30 strike and are absorbed by the other surfaces.

Figure 3:
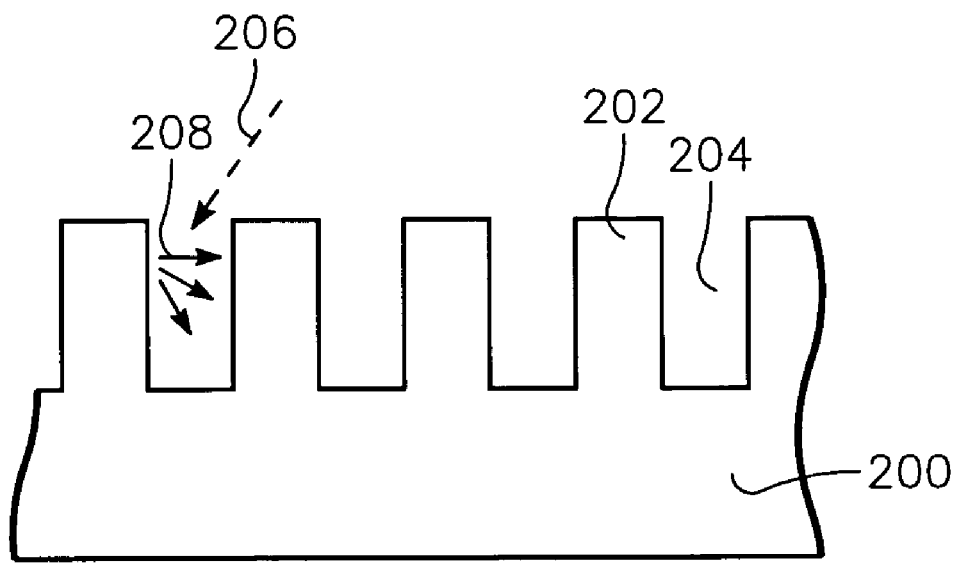
FIGS. 3 and 4 are alternative embodiment of a textured surface on the walls of the low-pass filter.
Figure 4:
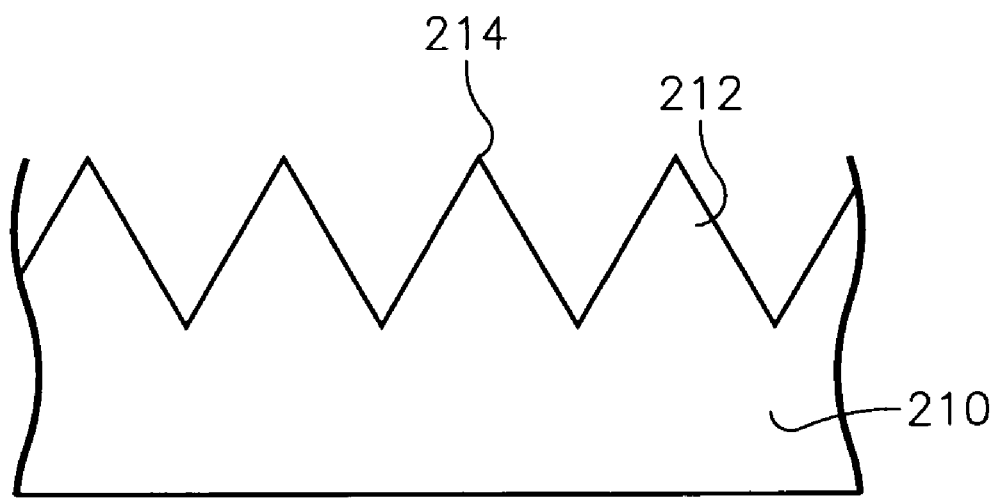

Two potential problems of higher-energy electrons striking the walls of the low-pass filter 30 is that they simply reflect rather than be absorbed or that they emit secondary electrons of lower energy which are then detected out of band. These problems can be reduced by a corrugated electrode structure illustrated in the cross-sectional view of FIG. 3. An electrode 200 or other wall of the filter is formed with teeth 202 and intervening grooves 204 on the side facing the interior of the filter and extending in the direction perpendicular to the illustration. The pitch and depth of the teeth 202 and grooves 204 is on the order of 1 mm, for example, 0.2 to 5 mm, and an aspect ratio of the grooves of at least 1. Preferably, the width of the grooves 204 is greater than that of the teeth 202. Thereby, when a primary electron 206 strikes the sidewall of the groove 204, its reflected trajectory will be towards other walls of the corrugated electrode 200 or secondary electrons 208 are likely to be emitted at angles such that they are absorbed by other walls within the grooves 204. That is, neither the reflected primaries nor the secondaries are likely to reenter the body of the filter to be detected as low energy electrons. The wall structure is not limited to the illustrated rectangular corrugation. For example, as illustrated in the cross-sectional view of FIG. 4, an electrode 210 may be formed with a serrated edge having triangular protrusions 212, preferably having the pitch and depth previously mentioned and preferably having acute apexes 214 with angles of less than 90° and preferably less than 60°. Other shapes are possible. The corrugated texturing produced by the teeth 202 and grooves 204 or triangular protrusions 212 result in a textured surface having portions of differing heights. The corrugated texturing is advantageously applied to the electrodes 70, 72, 78, and 80 within the low-pass filter 30 in an axisymmetric pattern about the central axis 12.

Returning to FIG. 2, the incident electron trajectory 50 is schematically illustrated as terminating either in a low-energy reflected trajectory 90 from the back of the high-pass filter 26 or a high-energy trajectory 92 absorbed by one of electrodes of the low-pass filter 30 or the detector housing 86. Only a passband trajectory 94 incident on the mesh of the detector 34 is detected.

The analyzer 10 is preferably enclosed in a magnetic shroud to exclude any extraneous magnetic field from affecting the low-energy electron trajectories. For similar reasons, all screws and other analyzer parts should be non-magnetic. The very low electron energies require that the analyzer be enclosed in a non-magnetic, e.g. aluminum, vacuum housing maintained at a very low pressure, for example, no greater than $10^{-8}$ ton. The sample 14 may be inserted within the vacuum housing and then the entire vacuum housing pumped down to the requisite pressure. Alternatively, an electron transmissive vacuum window described by Bryson et al in U.S. Pat. No. 6,803,570 may be interposed between the entry end of the analyzer 10, specifically the aspheric grid 16, and the sample held at a somewhat higher pressure.

Figure 5:
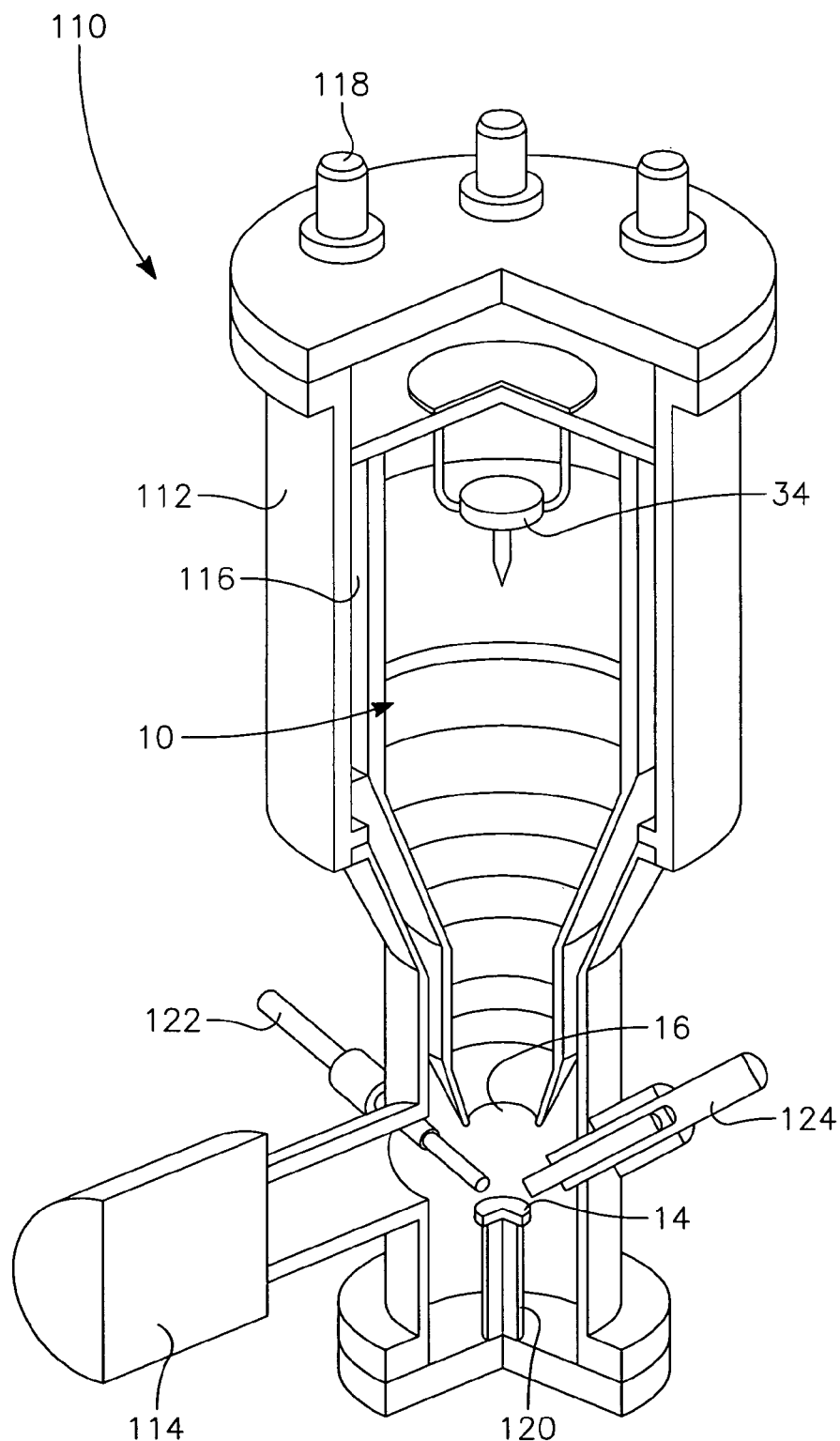
FIG. 5 is a partially sectioned orthographic view of an operational analyzer system.

An analyzer system 110 illustrated in the cutaway orthographic view of FIG. 5 includes a vacuum housing 112 pumped by a turbo pump 114. A magnetic shield 116 is interposed between the vacuum housing 112 and an aluminum shell on which the analyzer electrodes are supported and accurately aligned. Multiple electrical vacuum feedthroughs 118 provide biasing power to the electrodes and the detector 34 and pass out the detected signal. The vacuum housing 112 and magnetic shield 116 as well as the analyzer 10 itself are generally coaxial about the central axis. In the illustrated embodiment, the sample 14 is fixed to a pedestal 120 inside the vacuum housing 112 but the analyzer system 110 may be adapted to other types of sample handling or external sample chambers. This embodiment is designed for x-ray photoelectron spectroscopy (XPS) so two X-ray sources 122, 124 may irradiate the sample 14 to produce photoelectrons whose energy is analyzed by the energy analyzer 10. The analyzer system 110 may be adapted to other types of excitation sources such as high-energy electron guns.

Figure 6:
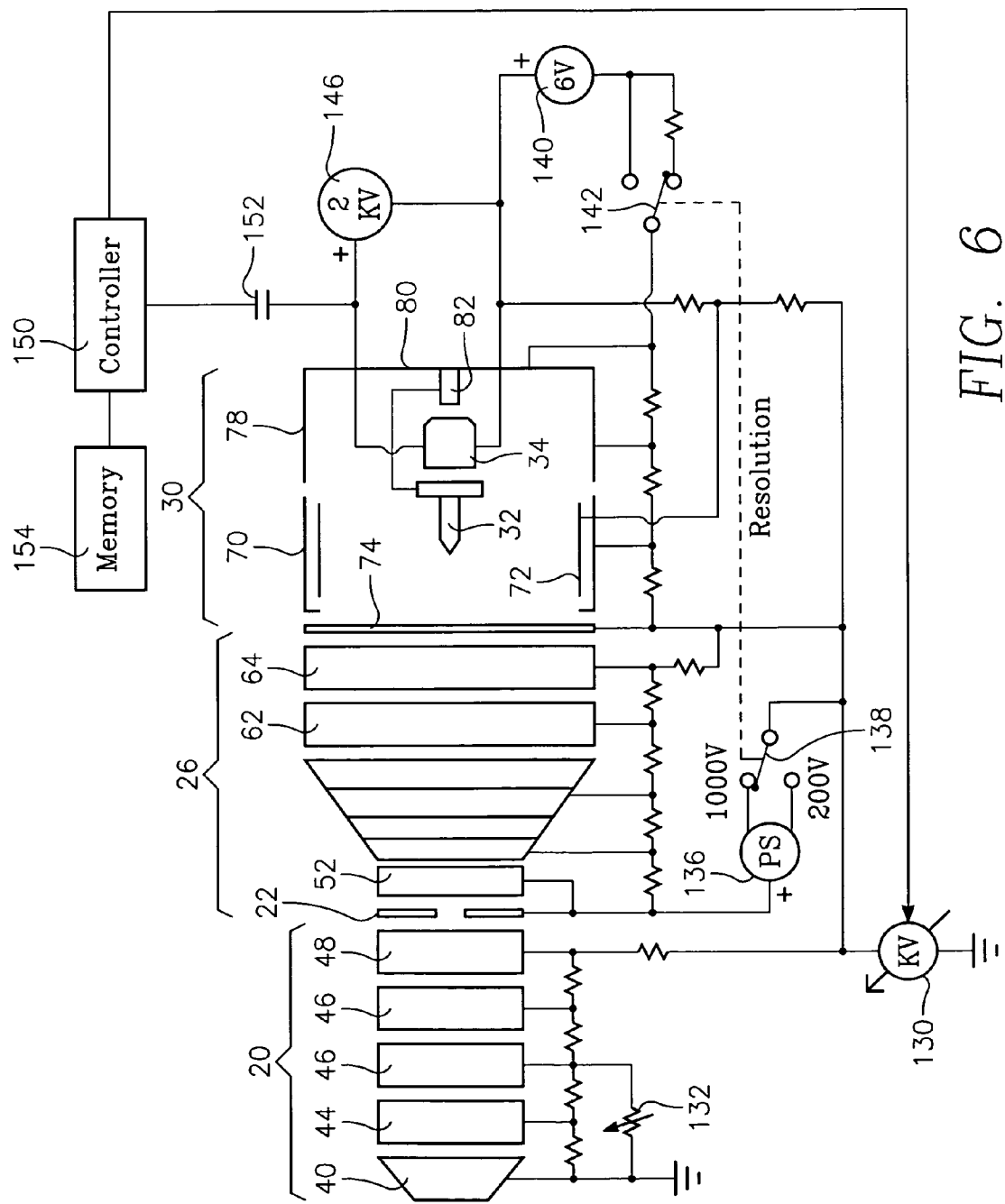
FIG. 6 is a schematic illustration of the electrical circuitry associated with the analyzer in one embodiment of the invention.

One embodiment of the electrical circuitry associated with the analyzer 10 is schematically illustrated in FIG. 6. A computer controlled DC power supply 130 operating, for example, between 0.3 and 1.6 kV controls the scan voltage delivered to the lens 20 through a resistor chain. A variable resistor 132 controls the focusing. A floating DC power supply 136 for the high-pass filter 26 applies a fixed between the iris 22 and the dual screen 74 of either its 200V or 1000V outputs connected through a toggle 138 to the output of the scan voltage supply 130 so that electrons passing through the iris 22 with a voltage less than 200 or 1000 eV cannot pass through the screen 74, but higher-energy electrons can. The toggle 138 determines whether the analyzer is being operated with low or high resolution. The voltage across the high-pass power supply 136 is distributed to the electrodes of the high-pass filter 26 through another resistor chain. Another DC power supply 140, for example, operating at 6V, controls the voltage applied to the low-pass filter electrodes distributed by a third resistor chain and to the detector 34. Another toggle 142 operating in tandem with the first toggle 138 determines the resolution. The voltage supplied to the dual screen 74 may be the same between the two screens or, as will be explained with reference to FIG. 7, differential voltages may be applied between them.

A high-voltage DC detector power supply 146, for example, operating at 2 kV but referenced to the low-pass power supply 140, powers the photo-multiplier tube. The electron signal is tapped from the line between the detector power supply 146 and the micro-channel plate detector 34 and is led to a controller 150 in the exterior through an AC coupling capacitor 152. The controller 152 controls the power of the lens power supply 130 and hence the energy scan of the electron analysis and stores the electron current measured by the detector 34 as a function of the scanning voltage to produce the desired energy spectrum. The controller 152 is typically a computer and includes a memory 154 which contains the control program and settings for the analyzer and which records the values of detected current in synchronism with the variation of the scan voltage of the lens power supply 130 to thereby produce an energy spectrum of the charged particles. However, other memory devices are possible to record the data including visual spectrum displays and strip recorders.

The dual screen 74 is at a potential at which electrons in the passband have an energy between 0 and 1 eV as they enter the low-pass filter 30. The high-pass filter 26 is advantageously operated at a fixed energy (1000 eV in the standard mode) so the electrons entering the high-pass filter 26 are within a fixed energy band, for example, 1000 to 1001 eV. The desired energy translation is accomplished by tying the negative side of the negative side of the high-pass power supply 136 to the dual screen 74 and the positive side to the iris 22.

As was previously briefly explained, the low-pass filter 30 is not completely effective and for one reason or another high-energy electrons may reach the detector 34. As illustrated in FIG. 7, if a toggle 156 is set to select a tie connection so that both grids 66, 74 of the dual screen 28 are equally biased from an input terminal, an electron beam 160 passing through the dual screen 28 consists of most of the electron above the energy $E_1$ at the lower edge of the passband. A measured transmission spectrum 162 is represented in FIG. 6. However, if the toggle 156 selects a voltage supply 158 to negatively bias the first grid 66 with respect to second grid 74 during a calibration mode to reflect energies within the passband so that an incident beam 164 should be totally reflected. Nonetheless, the combination of the detected desired lower-energy electrons and the detected higher-energy electrons, for instance some that are not rejected in the low-pass filter 30, and secondary electrons emitted from the electrodes in the low-pass filter 30, produce a measured transmission spectrum 166 during the calibration mode. Accordingly, in a calibration mode, the two grids 66, 74 are differentially biased and a electron spectrum is measured by scanning the voltages on the lens 20. The differential biasing, which may be accomplished by applying different voltages to the exit electrode 66 of the high-pass filter 26 and to the input electrode 70 of the low-pass filter 30, may be somewhat more than the expected resolution of the analyzer, that is, about 1V or perhaps twice that. Other means of selective differential biasing are possible including separate power supplies or a selected element in a resistive chain. The measured spectrum is a background or noise spectrum. In the normal mode, the grids 66, 74 are commonly biased. Values of the calibration spectrum are stored and then subtracted, for example, in the controller 150 from corresponding values on the spectrum measured in the normal mode to produce a corrected spectrum.

The graphs of FIG. 9 display the calculated transmission or throughput for the filters of an analyzer of the invention with the understanding that the lens accelerates or retards sample electrons of the desired energy to about 1000 eV and presents them to the sequentially arranged filters. The first, high-pass filter, as shown in spectrum 170, passes virtually no electrons up to an energy of 999 eV. Thereafter, the transmission coefficient rapidly rises over about 1 eV to near unity. On the other hand, the second, low-pass filter, as shown in spectrum 172, passes most electrons up to just above 999 eV. Thereafter, the transmission coefficient falls over about 1 or 2 eV to nearly zero. The total transmission, which is the product of the two spectra 170, 172, is shown in spectrum 174. The transmission FWHM passband is about 0.9 eV. However, if the background spectrum is subtracted from the total spectrum, the correct transmission, shown by a corrected spectrum 176, shows a passband of about 0.7 eV.

Although the invention has been developed as an electron analyzer, with proper scaling the invention may be applied to energy analyzers of other charged particles, such as positively charged ions.

The analyzer of the invention is capable of relatively high resolution in a small and lightweight structure. Nonetheless, the sensitivity or throughput may be ten times greater than that of the conventional analyzer in a laboratory-quality XPS. The coaxial design reduces the complexity and fabrication costs and also reduces the weight and size of the analyzer. Nonetheless, the analyzer can be made relatively rugged.

The invention claimed is:
1. A charge particle energy analyzer, comprising:
an electrostatic and non-magnetic lens arranged coaxially about a central axis for angularly focusing charged particles received from a sample disposed on the central axis onto an output and including a plurality of axially arranged and selectively and differentially electrically biasable electrodes capable of controlling an energy of the focused particles;

a biasable iris having a central aperture through which the central axis extends from the sample, which is positioned on the output of the electrostatic lens, and through which the lens focuses the charged particles;

an electrostatic and non-magnetic high-pass filter arranged coaxially about the central axis receiving the charged particles from the iris and rejecting those of the charged particles having an energy below a first energy;

an electrostatic and non-magnetic low-pass filter arranged coaxially about the central axis receiving the charged particles not rejected by the high-pass filter and rejecting those of the charged particles having an energy above a second energy; and a charged particle detector receiving the charged particles not rejected by the low-pass filter.

2. The analyzer of claim 1, further comprising a curved grid disposed on an input side of the lens with a concave side facing the sample.

3. The analyzer of claim 2, wherein the curved grid is aspherically shaped.

4. The analyzer of claim 3, wherein the curved grid is ellipsoidally shaped.

5. The analyzer of claim 1, wherein each of the lens, the high-pass filter, and the low-pass filter comprises a respective plurality of separately biasable electrodes coaxial with the central axis and the detector is disposed on the central axis.

6. The analyzer of claim 5, further comprising:
a first scanning DC power supply biasing the electrodes of the lens;
a second DC power supply biasing the electrodes of the high-pass filter; and
a third DC power supply biasing the electrodes of the low-pass filter.

7. The analyzer of claim 6, wherein the second DC power supply is selectable between two output voltages.

8. The analyzer of claim 1, further comprising a planar biasable screen disposed between the low-pass filter and the high-pass filter, wherein the screen comprises biasable first and second planar grids which are adjacent and separately biasable.

9. The analyzer of claim 1, wherein the charged particles are electrons.

10. The analyzer of claim 1, wherein biases applied across the high-pass and low-pass filters are fixed and a bias applied across the lens is continuously variable in synchronism with a memory associated with the detector.

11. The analyzer of claim 1, wherein the detector is positioned with the low-pass filter such that charged particles emerging from the high-pass filter must be deflected within the low-pass filter to reach the detector.

12. The analyzer of claim 1, wherein an internal surface of an electrode of the low-pass filter formed in a conductive member are textured such that portions of differing heights of the internal surface are held at a common potential.

13. A charge particle energy analyzer, comprising:
an electrostatic and non-magnetic high-pass filter which is arranged coaxially about a central axis extending from a sample disposed on the central axis, which receives charged particles from the sample producing the charged particles, and which rejects those of the charged particles having an energy below a first energy;
an electrostatic and non-magnetic low-pass filter arranged coaxially about the central axis receiving the charged particles not rejected by the high-pass filter and rejecting those of the charged particles having an energy above a second energy;
an electrically biasable planar screen extending perpendicularly to the central axis and disposed between the high-pass and low-pass filters, wherein the biasable screen includes two adjacent separately biasable planar grids extending perpendicularly to the central axis; and
a charged particle detector receiving the charged particles not rejected by the low-pass filter.

14. The analyzer of claim 13, further comprising a particle block absorbing charged particles arranged on and along the central axis between the screen and the detector, which is disposed on the central axis, such that charged particles entering the low-pass filter must be deflected to be detected by the detector.

15. The analyzer of claim 13, further comprising
an electrically biasable iris having a central aperture through which the central axis extends and positioned on an input side of the high-pass filter; and
an electrostatic and non-magnetic lens arranged coaxially about the central axis between the sample and the iris for focusing the charged particles received from the sample to the aperture and in combination with the biasable iris being capable of controlling an energy of the charged particles received by the low-pass filter.

16. A method of analyzing the energy of charged particles emitted from a sample disposed on a central axis, comprising the steps of:
electrostatically and non-magnetically focusing toward the central axis the charged particles emitted from the sample to a central aperture which is arranged about the central axis and through which the central axis extending from the sample and the charged particles pass;
a first step of electrostatically and non-magnetically blocking the charged particles passing the aperture having an energy below a first energy;
a second step of electrostatically and non-magnetically blocking the charged particles not blocked by the first step and having an energy above a second energy;
detecting the charged particles not blocked by the second step; and
varying velocities of the charged particles during the focusing to cause energy bands of the charged particles determined by the varying which are different prior to the focusing to pass through the aperture with a same energy.

17. The method of claim 16, wherein the same energy is independent of initial energies of the charged particles prior to the focusing and varying steps.

18. The method of claim 16, further comprising:
a calibration step in which the first step is arranged to block all charged particles and further including measuring a background spectrum of the charged particles detected in the calibration step; and
an operational step in which the first step is arranged to pass the charged particles with energies below the first energy, and further including subtracting the background spectrum from a level of detected charged particles.

19. The analyzer of claim 1,
wherein the high-pass filter includes a plurality of differentially biased first electrodes arranged along and annular about the central axis, and
wherein the low-pass filter includes a plurality of differentially biased second electrodes arranged along and annular about the central axis.

20. The method of claim 16, wherein the aperture is a circular central aperture formed in an iris.

21. The analyzer of claim 1, wherein all lensing and filtering disposed between the sample and the detector including the lens and the high-pass and low-pass filters consist of biasable electrodes coaxial about the central axis.

22. The analyzer of claim 1, wherein the sample is located in a field-free region relative to the analyzer.

23. The analyzer of claim 8, further comprising circuitry capable of varying a difference in potential between the first and second planar grids.

24. The analyzer of claim 23, wherein the circuitry (1) imposes a differential potential between the first and second planar grids during a calibration mode and the detector accordingly measures a calibration spectrum, (2) imposes a common potential to the first and second planar grids during an operational mode and the detector according measures an operational spectrum, and (3) differences the operational spectrum and the calibration spectrum to produce a corrected spectrum.

25. The analyzer of claim 13, wherein all lensing and filtering disposed between the sample and the detector including the high-pass and low-pass filters consist of biasable electrodes coaxial about the central axis.

26. The method of claim 16, wherein no low-pass filtering is performed between the focusing step and the first step.

27. The method of claim 16, wherein the sample is located in a region free of fields produced by the focusing step.

28. The apparatus of claim 20, wherein the focused charged particles pass through the aperture.

29. The analyzer of claim 1, wherein the iris is biasable independently of elements in an upstream direction toward the lens and wherein the lens focuses the charged particles to have trajectories crossing the central axis adjacent the iris.

30. The analyzer of claim 1, wherein the low-pass filter acts as an electrostatic reflecting lens and deflects the charged particles not rejected by the low-pass filter to the charged particle detector.

31. The analyzer of claim 13, wherein during a measuring mode of the analyzer the two planar grids are commonly biased.

32. The method of claim 18, wherein the charge particles pass through two adjacent planar grids between the first and second steps and further comprising:
  during the calibration step, differentially biasing the two grids; and
  during the operational step, commonly biasing the two grids.

33. The analyzer of claim 1, further comprising an input grid disposed between the sample and the lens and held at the same electrical potential as the sample.

34. The analyzer of claim 13, further comprising an aspherical grid disposed between the sample and the high-pass filter.

* * * * *